(12) United States Patent
Ferber et al.

(10) Patent No.: US 7,331,676 B2
(45) Date of Patent: Feb. 19, 2008

(54) APPARATUS FOR PROJECTING A REDUCED IMAGE OF A PHOTOMASK USING A SCHWARZSCHILD OBJECTIVE

(75) Inventors: Joerg Ferber, Angerstein (DE); Henning Schmidt, Goettingen (DE)

(73) Assignee: Coherent, Inc., Santa Clara, CA (US)

( * ) Notice: Subject to any disclaimer, the term of this patent is extended or adjusted under 35 U.S.C. 154(b) by 235 days.

(21) Appl. No.: 11/348,185

(22) Filed: Feb. 6, 2006

(65) Prior Publication Data
US 2006/0175557 A1   Aug. 10, 2006

Related U.S. Application Data

(60) Provisional application No. 60/651,193, filed on Feb. 9, 2005.

(51) Int. Cl.
G03B 21/14 (2006.01)
(52) U.S. Cl. ............................................. 353/20; 349/9
(58) Field of Classification Search .................... 353/7, 353/8, 20, 31; 349/8, 9; 359/464, 465, 472, 359/494, 495, 497, 501; 355/30, 55, 60
See application file for complete search history.

(56) References Cited

U.S. PATENT DOCUMENTS

| | | | |
|---|---|---|---|
| 6,313,433 B1 | 11/2001 | Sukman et al. | 219/121.67 |
| 6,423,925 B1 | 7/2002 | Sukhman et al. | 219/121.6 |
| 6,501,781 B1 | 12/2002 | Maurer et al. | 372/75 |
| 6,520,643 B1* | 2/2003 | Holman et al. | 353/20 |
| 6,771,683 B2 | 8/2004 | Scaggs | 372/57 |
| 2004/0036037 A1 | 2/2004 | Rothweiler et al. | 250/492.2 |

FOREIGN PATENT DOCUMENTS

DE   195 33 314 A1   3/1997
JP   7-220990   8/1995

OTHER PUBLICATIONS

J.E. Bjorkholm et al., "Reduction imaging in 14 nm using multilayer-coated optics: Printing of features smaller than 0.1 μm," Journal of Vacuum Science & Technology B, vol. 8, No. 6, Nov./Dec. 1990, pp. 1509-1513.

* cited by examiner

Primary Examiner—Kiet T. Nguyen
(74) Attorney, Agent, or Firm—Stallman & Pollock LLP

(57) ABSTRACT

An optical system for projecting an image of a photomask on a substrate, using a Schwarzschild objective includes an excimer laser, beam shaping optics for shaping a laser beam from the laser and a beam-dividing prism. The beam-dividing prism has a dividing-face including four facets inclined at an angle to each other. The four facets divide the shaped beam into four beam-portions propagating at an angle to the system axis. The beam-portions overlap at the photomask and mutually diverge into the entrance aperture in the concave mirror of the Schwarzschild objective such that all of the light in the beam portions is incident on the convex mirror of the objective in an annular zone outside of the central obscuration zone of the convex mirror. This essentially eliminates transfer losses normally caused by this obscuration zone.

21 Claims, 2 Drawing Sheets

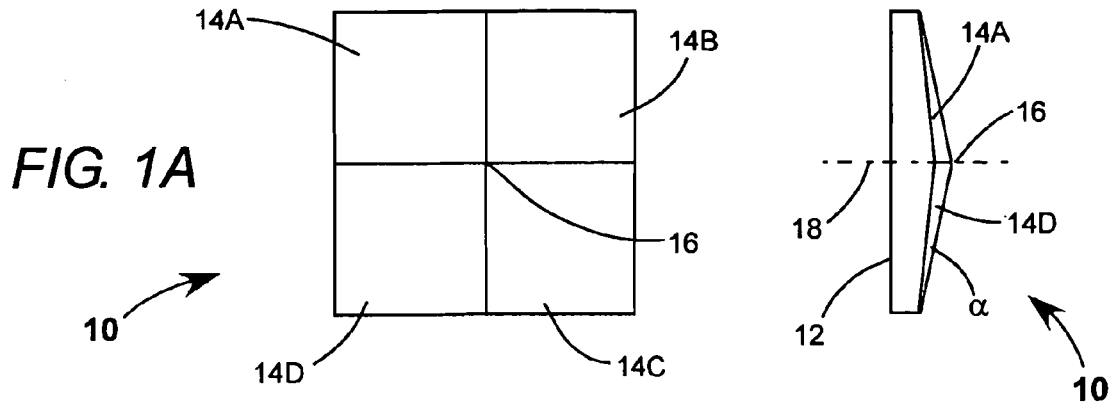
*FIG. 1A*
*FIG. 1B*
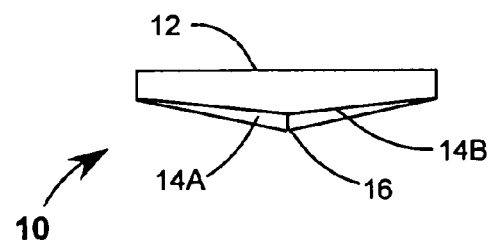
*FIG. 1C*
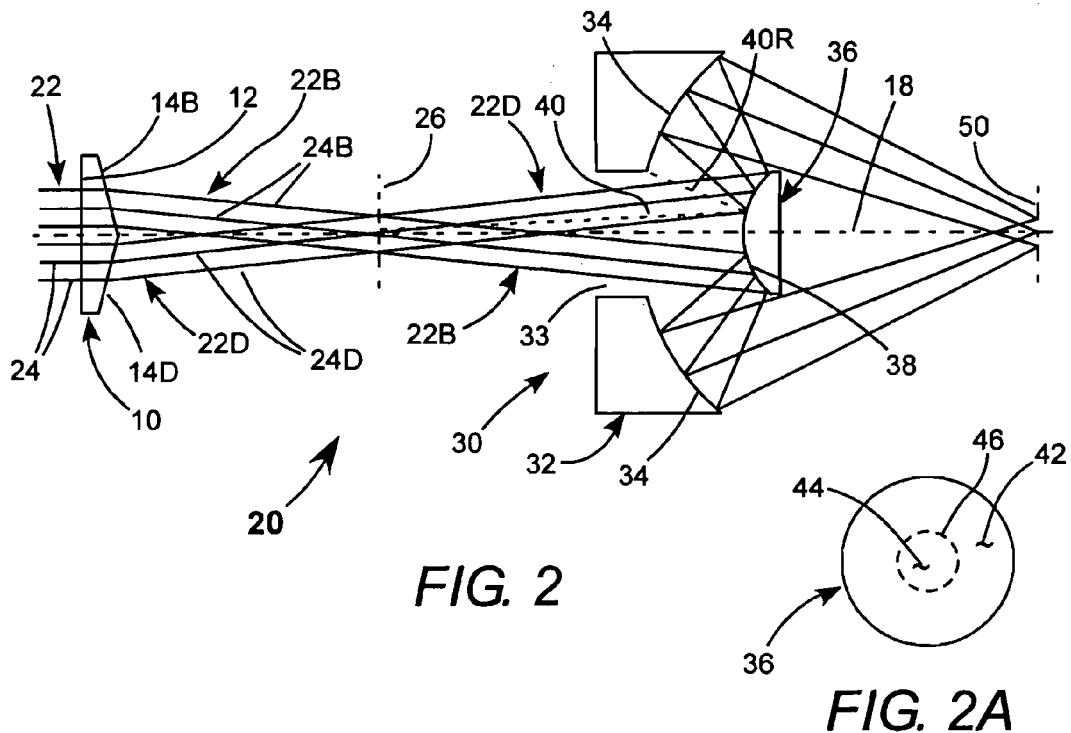
*FIG. 2*
*FIG. 2A*

APPARATUS FOR PROJECTING A REDUCED IMAGE OF A PHOTOMASK USING A SCHWARZSCHILD OBJECTIVE

PRIORITY

This application claims priority from U.S. Provisional Application Ser. No. 60/651,193, filed Feb. 9, 2005, the disclosure of which is incorporated by reference.

TECHNICAL FIELD OF THE INVENTION

The present invention relates in general to optical projection systems for forming a reduced image of a photomask on a substrate in ultraviolet (UV) optical lithography operations. The invention relates in particular to such projection systems that use a Schwarzschild objective for projecting the reduced image.

DISCUSSION OF BACKGROUND ART

In an optical system for projection a reduced image of a photomask on a substrate in UV micromachining operations it is desirable to provide a high intensity of illuminating radiation at the photomask and to transfer as much as possible of the illumination of the photomask into the reduced image of the photomask on the substrate. A commonly used projection optic for projecting the mask image is a Schwarzschild objective. A Schwarzschild objective is one, well-known, embodiment of an on-axis (the optical axis of the projection system) reflective telescope, used in reverse, in which light from the illuminated photomask passes through a primary mirror having a concave reflective surface via a central aperture in the primary mirror, and is reflected from an on-axis convex secondary mirror onto the concave reflective surface of the primary mirror. Here, it should be noted that the terms "primary mirror" and "secondary mirror", used here and in the description of the invention presented herein below are the terms that are normally used in designating mirrors of a reflective telescope and do not reflect the order in which radiation strikes the mirrors when a reflective telescope is used in reverse as a reducing objective.

An all-reflective objective such as the Schwarzschild objective has an advantage that reflective optical elements can provide less loss of (UV) light through absorption of the light than refractive elements. The Schwarzschild and similar all reflective objectives have a partially offsetting disadvantage that light entering the objective close to the axis or at low inclination to the axis is reflected from the secondary mirror, back through the aperture in the primary mirror, creating, in effect, a "dark zone" or zone of obscuration on the secondary mirror close to the axis.

In prior-art optical systems, designs to minimize the effect of the dark zone in causing energy transfer losses have employed using a costly, difficult-to-implement system of cylindrical lenses and beam homogenizing elements to evenly distribute illumination light across the photomask and thereby reduce concentration of illumination on the central dark zone of the secondary mirror. Such a system is described in detail in German Patent Publication DE 195 33 314, the complete disclosure of which is hereby incorporated by reference. There is a need for a UV optical projection system that minimizes transfer losses due to the dark zone of a Schwarzschild objective or the like, but that is less costly and less difficult to implement than optical systems of the type described in the '314 publication.

SUMMARY OF THE INVENTION

The present invention is directed to apparatus for illuminating a mask with a beam of radiation and projecting an image of the mask on a substrate. Such apparatus typically has a mask location at which the mask to be imaged is placed, and an image location at which the substrate is placed to receive the projected image. In one aspect, apparatus in accordance with the present invention comprises an objective including a convex first mirror and concave second mirror, spaced apart and facing toward each other. The second mirror is larger than the first mirror and has an aperture therein providing optical access to said first mirror. A prism is located in the path of the beam of radiation to the mask location. The prism has a plurality of facets. The facets are configured and arranged such that the beam is divided thereby into a plurality of beam-portions, the beam portions being mutually convergent on leaving the prism. The mutually convergent beam-portions intersect in the object location, then mutually diverge through the aperture in the second mirror such that essentially all of the radiation in the beam portions is incident in an annular zone on the first mirror. The beam portions incident in the annular zone are reflected onto the second mirror and reflected by the second mirror to a focus in the substrate location.

Overlapping the beam-portions provides for high illumination intensity on the mask. Having all of the radiation in the beam-portions incident in the annular zone of the first mirror minimizes radiation losses due to the above-discussed dark-zone of the convex mirror of such an objective.

In a one preferred embodiment of the invention, the objective is a Schwarzschild objective and the dividing face of the prism has four facets dividing the beam into four portions. The prism may have less than four or more than four facets, but the facets preferably meet a common point on the optic axis of the apparatus. The inventive optical system is directed primarily to imaging using light from an excimer laser, but is not limited to imaging with such a laser.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A is a plan view schematically illustrating an optical element in accordance with the present invention having one plane face and four surfaces or facets opposite the plane face for dividing a beam of radiation incident thereon into four beam-portions propagating at an angle to each other.

FIG. 1B is a side-elevation view schematically illustrating detail of a first and third of the facets of the optical element of FIG. 1A.

FIG. 1C is a front-elevation view schematically illustrating detail of a first and second of the facets of the optical element of FIG. 1A.

FIG. 2 is an unshaded cross-section view schematically illustrating an optical arrangement in accordance with the present invention wherein a collimated beam is divided into four collimated beam-portions by an example of the four-faceted optical element of FIGS. 1A-C, and the four collimated beam-portions are focused by a Schwarzschild objective.

FIG. 2A is an end view of the convex mirror of the Schwarzschild objective shown from the left side of FIG. 2.

DETAILED DESCRIPTION OF THE INVENTION

Figure 3:
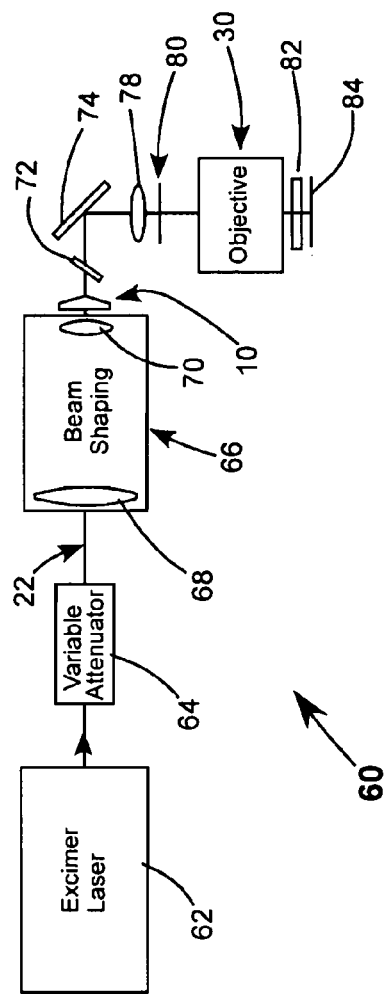
FIG. 3 schematically illustrates an optical system layout for imaging a mask on a substrate in accordance with the present invention, in which a laser beam is shaped by a beam-shaping telescope, and is divided into four beam-portions by an example of the four-faceted optical element of FIGS. 1A-C, and in which a field lens converges the four beam-portions to intersect on the mask to illuminate the mask, and a Schwarzschild objective images the illuminated mask on the substrate.

FIG. 1A, FIG. 1B, and FIG. 1C schematically illustrate an optical beam-dividing element or prism 10 of a type which is used in apparatus in accordance with the present invention. Prism 10, in this example thereof, has one plane face 12, which preferably is used as an entrance face, and four faces or facets 14A, 14B, 14C, and 14D, which are preferably used as exit faces. Here, the facets are rectangular (square) of equal size and meet at a central apex point 16 of the prism. The prism is intended for use with apex 16 thereof aligned on, and entrance face 12 thereof perpendicular to, a longitudinal optical axis 18 of an optical system in accordance with the present invention (see FIG. 1B). Facets 14A-D are tilted at an angle α to entrance surface 12 of the prism. The prism itself, of course, can be considered as having a longitudinal axis (not shown) collinear with optical axis 18.

FIG. 2 is an un-shaded cross-section view, schematically illustrating a basic optical arrangement 20 in accordance with the present invention, in one transverse axis thereof, for forming a reduced image of a mask on a substrate. A prism 10 receives a collimated beam of radiation 22 designated, here, by six rays 24. The beam enters the prism via entrance face 12 thereof and is incident on all four facets (14A-D) of the prism. Facets 14B and 14D divide beam 22 into two corresponding beam-portions 22B and 22B designated, respectively, by rays 24B and 24D. Those skilled in the art will recognize without further illustrate that there will two corresponding beam-portions (created by facets 14A and 14C of prism 10) in a plane perpendicular to the plane of FIG. 2.

A mask (not shown) to be imaged would be located in a plane 26 in which beams 22B and 22D (and the two corresponding beam-portions not visible) intersect. At the intersection point of the beam, the intensity or radiation will be about four times that in the original beam 22. Beams 22B and 22D, and the two corresponding beams not shown, diverge from the mask location (plane 26) and enter a Schwarzschild objective 30 via an aperture 33 in primary mirror 32 thereof. Primary mirror 32 has a concave reflective surface 34. A secondary mirror 36 of the Schwarzschild objective has a convex reflective surface 38. In a typical Schwarzschild objective, surfaces 34 and 38 are spherical surfaces. This, however, such not be construed as limiting the present invention. Here again, it should be noted that the terms "primary" and "secondary" as applied to mirrors 32 and 36 in this description of the invention are the terms that are normally used in designating mirrors of a reflective telescope, and do not reflect the order in which radiation strikes the mirrors when a reflective telescope is used in reverse as a reducing objective as depicted in FIG. 2.

Continuing with reference to FIG. 2, and with reference in addition to FIG. 2A, the facet inclination angle α (see FIG. 1B) is preferably selected in accordance with the refractive index of the material of prism 10, and the axial distance of the prism from secondary mirror 36, such that preferably, essentially all rays in the diverging beams are incident on reflecting surface 38 of secondary mirror in an annular zone 42 thereof (see FIG. 2A) centered on the system axis, outside the above-discussed, circular "dark zone" or obscuration 44 of the mirror, indicated, here, as bounded by dashed line 46. Accordingly, all rays in the beams are reflected from surface 38 of mirror 36 onto concave reflecting surface 34 of mirror 32, and are reflected to from image points in plane 50 thereby imaging mask plane 26 in plane 50. The surface of a substrate (not shown) would be located in plane 50 to receive a mask image. The image points are the points at which diverging rays from a corresponding point in the object plane intersect in the image plane. Those skilled in the art will recognize that the degree reduction in size of the image compared with the size of the mask depicted by the ray trace of FIG. 2 is less than would usually be the case in practice. The degree of reduction depicted is selected, here, merely for convenience of illustration.

Dashed line 46 is approximately the locus of hypothetical ray paths originating on axis 18 at plane 26 (such as the path designated by line dotted line 40) that are at the minimum inclination to axis 18 required to be reflected from surface 38 of mirror 36 onto surface 34 of mirror 32, as indicated by dashed line 40R. Any ray originating on axis at plane 26 having less than this incidence angle will be reflected back into aperture 30 and, accordingly, will not reach the image plane. Dividing beam 22 in to portions that mutually diverge into the aperture can provide that essentially all of the light (radiation) in the original beam is incident on surface 38 of mirror 36 outside of the dark-zone.

In the arrangement of FIG. 2 it is assumed that a beam of collimated radiation is received from some source thereof such as a laser delivering a $TEM_{00}$-quality beam, or from a laser via well corrected collimating optics. Certain types of laser, however, deliver beams that need to be "shaped", i.e., have the beam cross-section thereof altered in size or shape, before the beam can be used to illuminate a mask. Excimer lasers that are used as radiation (light) sources for mask projection typically deliver a beam that has an elongated cross section, for example, having a length of about 35 millimeters (mm) and a width of about 12 mm. The length and width directions of such a beam are usually referred to by practitioners of the art as the long-axis and the short-axis, respectively, of the beam. In mask projection systems including such a laser there are beam-shaping optics and beam-homogenizing optics and eventually a field lens that collects a shaped and homogenized beam and projects the shaped and homogenized beam into a mask stage for illuminating a mask to be imaged. In such a system the mask is not illuminated by a collimated beam and the arrangement of FIG. 2 is not practical.

FIG. 3 schematically illustrates in functional block-diagram form, an excimer-laser optical apparatus 60 in accordance with the present invention for projecting a mask on a substrate using a Schwarzschild objective. Apparatus 60 includes an excimer laser 62 delivering a beam 20 that is substantially collimated but has an elongated cross-section as discussed above. The beam traverses a variable attenuator 64 for regulating the power in the beam, and traverses beam-shaping optics (telescope) 66, including cylindrical lenses 68 and 70, that are arranged to reduce the long-axis dimension of the beam. Beam 20 leaves beam-shaping optics 68, traverses a prism 10 in accordance with the present invention, then traverses an optional beamsplitter 72. Beamsplitter 72 may be used, for example, to direct a small portion of the beam to an apparatus for performing beam diagnostics. After traversing the beamsplitter, the beam is directed by a turning mirror to a field lens 78 that projects the beam onto a mask 80 to be imaged. The mask is imaged by a Schwarzschild objective 30, through an optional output-window 82, onto a substrate 84.

Figure 4:
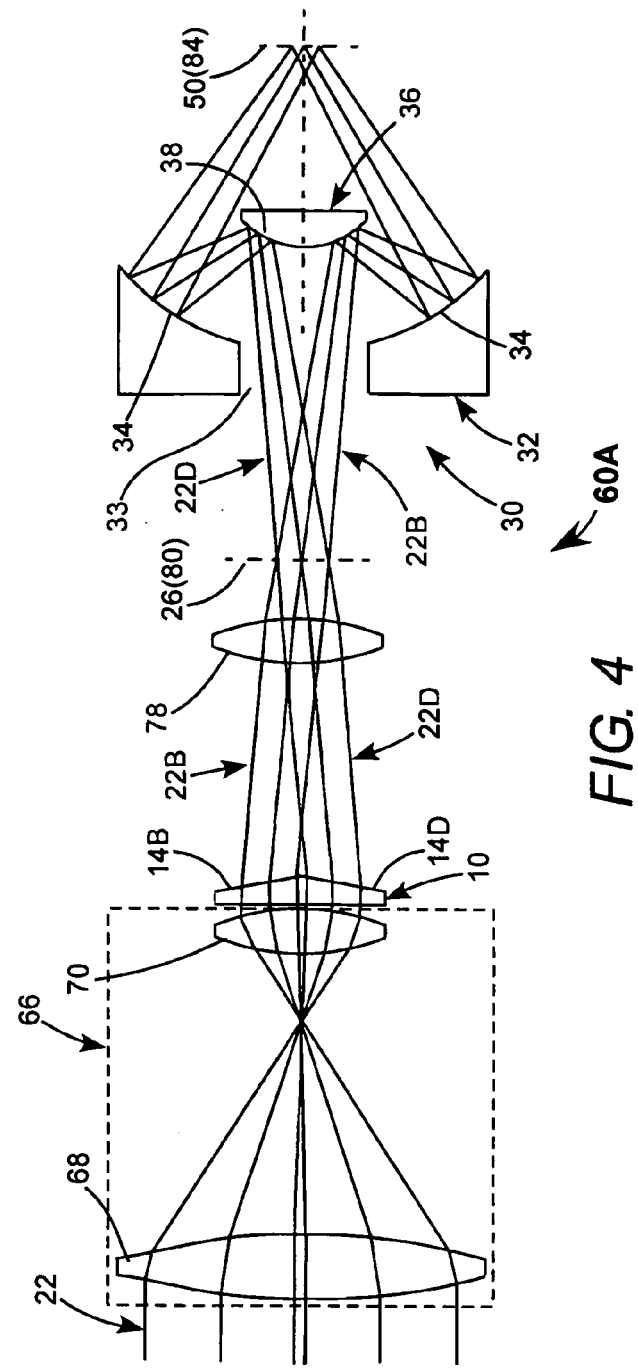
FIG. 4 is an unshaded cross-section view schematically illustrating detail of an example of the beam-shaping telescope, the four-faceted optical element, the field lens, and the Schwarzschild objective of FIG. 3.

FIG. 4 is an un-shaded cross-section view schematically illustrating details of one example 60A of beam-shaping shaping optics, beam-dividing prism, field lens and Schwarzschild objective in the apparatus of FIG. 3. In FIG. 4, the optical path is foreshortened and unfolded, with mirror 74 and beamsplitter 72 omitted, for convenience of illustration. In this example, beam 22 is not collimated on leaving cylindrical lens 70 of beam-shaping optics 66, but is still divided into four beam-portions, with only portions 22B and 22D visible here, as discussed above with reference to FIG. 2. Beam-portions 22B and 22D are individually slightly diverging, but mutually converging. Field lens 78 causes the beam-portions to become individually converging and also increases the mutual convergence of the beam-portions. The beam-portions intersect in mask plane (object plane) 26, in which mask 80 would be located, and then are mutually diverging on entering aperture 33 of mirror 34 of Schwarzschild objective 32.

Objective 30 is arranged with respect to lens 78 such that essentially all of the radiation (light) in all of the beam-portions is incident on convex surface 38 of mirror 36 of the objective in the annular region 42 thereof surrounding dark zone 44 (not shown in FIG. 4) as discussed above with reference to FIG. 2A. Light in the beam-portions is reflected from the annular region of mirror 36 onto reflective surface 34 of mirror 32 which reflects the beam portions to image points in an image plane 50 in which substrate 84 would be placed to receive the mask image.

An incidental, but nonetheless advantageous property of prism 10 is that the prism can serve as a beam homogenizer for providing uniformity of light in the mask plane. By way of example, if a beam incident on the prism having a center-weighted distribution of light, such as a Gaussian distribution, traverses the prism, then, in plane 26, where the beam portions created by the prism intersect, at the edge of the intersecting beams the highest intensity of one beam portion, for example 14B, will sum with the lowest intensity of the complementary beam portion 14D. In this way it is possible to achieve at plane 26 a uniformity of illumination of about plus or minus 5% of a nominal average intensity without supplementary homogenizing optics. This is less uniformity, of course, than could be achieved with above-discussed state-of-the art homogenizers including cylindrical lens arrays and the like, but is achieved with significantly less cost and complexity, while still fulfilling the object of the present invention in avoiding radiation loss at the dark or obscuration-zone of the Schwarzschild objective.

It is emphasized, here that the arrangements of the beam dividing prism together with the Schwarzschild objective discussed above are but two possible arrangements. Those skilled in the art, from the description provided above, may devise other arrangements without departing from the spirit and scope of the present invention. The invention is described with reference to an-all reflective objective, which is preferred for use with ultraviolet radiation from excimer lasers. Principles of the invention are equally applicable for use with a catadioptric objective, having the convex and concave mirrors of an all reflective objective but having one or more additional refractive elements for optical correction or the like.

Further, while prism 10 is described above as having four exit-facets, it is possible to deploy, in the above described and other arrangements in accordance with the present invention, a prism having more or less facets (although there must be at least two) without departing from the spirit and scope of the present invention. It is also possible to orient prism 10 such that beam 20 enters the prism via the facets and leaves the prism via face 12 thereof. It is even possible to deploy a prism having sloping facets of on each side thereof, with the corresponding facets on opposite sides of the prism being of the same number and shape, and exactly aligned with each other.

In summary, the present invention is described above in terms of a preferred and other embodiments. The invention is not limited, however, to the embodiments described and depicted. Rather the invention is limited only by the claims appended hereto.

What is claimed is:

1. Apparatus for illuminating a mask with a beam of radiation and projecting an image of the mask on a substrate, the apparatus having an optic-axis, a mask location and an image location, the apparatus comprising:

an objective for forming the image, said objective including a convex first mirror and concave second mirror spaced apart and facing toward each other, said second mirror being larger than said first mirror and having an aperture therein providing optical access to said first mirror;

a prism located in the path of the beam of radiation prior to the mask location, said prism having a plurality of facets, said facets being configured and arranged such that the beam is divided thereby into a plurality of beam-portions, said beam portions being mutually convergent on leaving said prism; and wherein said mutually convergent beam-portions intersect in the mask location then mutually diverge through said aperture in said second mirror such that substantially all of the radiation in said beam portions is incident in an annular zone on said first mirror, said beam portions incident in said annular zone being reflected onto said second mirror and being reflected by said second mirror to image points in the substrate location.

2. The apparatus of claim 1, wherein said first mirror, said second mirror, and said aperture in said second mirror are aligned on the optic-axis of the mirror, and said facets of said prism meet at an apex thereof aligned with the optic axis.

3. The apparatus of claim 1, wherein said prism has a plane face and said facets are opposite said plane face.

4. The apparatus of claim 3, wherein said prism has four rectangular facets of equal size and shape meeting at a common point.

5. The apparatus of claim 3, wherein the beam of radiation enters said prism via said plane face thereof and leaves said prism via said facets.

6. The apparatus of claim 1, further including an optical arrangement in the path of the beam of radiation to said prism for changing the cross-section shape of the beam before the beam is incident on said prism.

7. The apparatus of claim 1, further including a lens located in the path of the beam portions between said prism and the mask location.

8. The apparatus of claim 7, wherein said mutually divergent beam-portions on entering said aperture in said second mirror are individually convergent.

9. The apparatus of claim 1, wherein said beam on entering said prism is collimated and said mutually divergent beam portions on entering said aperture in said second mirror are collimated.

10. The apparatus of claim 1, wherein said first and second mirrors have spherical reflective surfaces.

11. Apparatus for illuminating a mask with a beam of radiation and projecting an image of the mask on a substrate, the apparatus having an optic-axis, a mask location and an image location, the apparatus comprising:

an objective for forming the image, said objective including a convex first mirror and concave second mirror spaced apart and facing toward each other, said second mirror being larger than said first mirror and having an aperture therein providing optical access to said first mirror;

a prism located in the path of the beam of radiation prior to the mask location, said prism having a plurality of facets, said facets being configured and arranged such that the beam is divided thereby into a plurality of beam-portions, said beam portions being mutually convergent on leaving said prism; and wherein said mutually convergent beam-portions intersect in the mask location then mutually diverge through said aperture in said second mirror such that illumination of a central zone of said first mirror by said beam portions is minimized and with said beam portions incident in an annular zone surrounding said central zone being reflected onto said second mirror and being reflected by said second mirror to image points in the substrate location.

12. The apparatus as recited in claim 11, wherein said first mirror, said second mirror, and said aperture in said second mirror are aligned on the optic-axis of the mirror, and said facets of said prism meet at an apex thereof aligned with the optic axis.

13. The apparatus of claim 11, wherein said prism has a plane face and said facets are opposite said plane face.

14. The apparatus of claim 13, wherein said prism has four rectangular facets of equal size and shape meeting at a common point.

15. An optical system for projecting an image of a mask on a substrate, the optical system having an optic axis, the optical system comprising:

a light source for providing a beam of light;

optics for directing the light beam toward an object plane in which the mask to be imaged is positioned;

an objective for forming the image of the mask, said objective including a primary mirror and a secondary mirror, said primary mirror having an entrance aperture therein providing an entrance aperture of said objective;

a prism located in the path of said light beam directed toward said object plane and including a plurality of facets at an angle to each other; and said beam directing optics, said prism and said objective configured and arranged with respect to each other such that said beam is divided by said prism facets into corresponding plurality of beam portions, said beam portions propagating at an angle to the optical axis of the optical system and at an angle to each other, overlapping at the mask position in the object plane, and diverging into said entrance aperture of said objective.

16. The optical system of claim 15, wherein said secondary mirror is located on the optical axis in the path of said beam portions diverging into said entrance aperture of said objective, and divergence of said beam portions is selected such that illumination of a central zone of said secondary mirror by said beam portions is minimized.

17. The optical system of claim 16, wherein said facets of said prism meet at an apex thereof aligned with the optic axis.

18. The optical system of claim 17, wherein said prism has a plane face and said facets are opposite said plane face.

19. The optical system of claim 18, wherein said prism has four rectangular facets of equal size and shape meeting at a common point.

20. The optical system of claim 16, wherein said diverging beam-portions on entering said aperture in said primary mirror are individually convergent.

21. The optical system of claim 16, wherein said beam on entering said prism is collimated and said diverging beam portions on entering said aperture in said primary mirror are collimated.

* * * * *